(12) United States Patent
Yang et al.

(10) Patent No.: US 11,205,618 B2
(45) Date of Patent: Dec. 21, 2021

(54) GRAPHENE BARRIER LAYER

(71) Applicant: Taiwan Semiconductor Manufacturing Co., Ltd., Hsinchu (TW)

(72) Inventors: Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/571,279

(22) Filed: Sep. 16, 2019

(65) Prior Publication Data
US 2021/0082829 A1 Mar. 18, 2021

(51) Int. Cl.
*H01L 23/532* (2006.01)
*H01L 21/768* (2006.01)
*H01L 23/522* (2006.01)
*H01L 21/324* (2006.01)

(52) U.S. Cl.
CPC ...... *H01L 23/53238* (2013.01); *H01L 21/324* (2013.01); *H01L 21/76876* (2013.01); *H01L 23/5226* (2013.01)

(58) Field of Classification Search
CPC .................. H01L 23/53238; H01L 23/5226
See application file for complete search history.

(56) References Cited

U.S. PATENT DOCUMENTS

2018/0166333 A1* 6/2018 Yang ................. H01L 23/53295

OTHER PUBLICATIONS

Kwak J. et al. Near room-temperature synthesis of transfer-free graphene films, Nature Communications, 3:645 doi: 10.1038/ncomms1650 (2012).

* cited by examiner

*Primary Examiner* — Jay C Chang
*Assistant Examiner* — Mikka Liu
(74) *Attorney, Agent, or Firm* — Haynes and Boone, LLP

(57) ABSTRACT

Interconnect structures and method of forming the same are disclosed herein. An exemplary interconnect structure includes a first contact feature in a first dielectric layer, a second dielectric layer over the first dielectric layer, a third dielectric layer over the second dielectric layer, a second contact feature extending through the second dielectric layer and the third dielectric layer, and a graphene layer between the second contact feature and the third dielectric layer.

20 Claims, 16 Drawing Sheets

GRAPHENE BARRIER LAYER

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
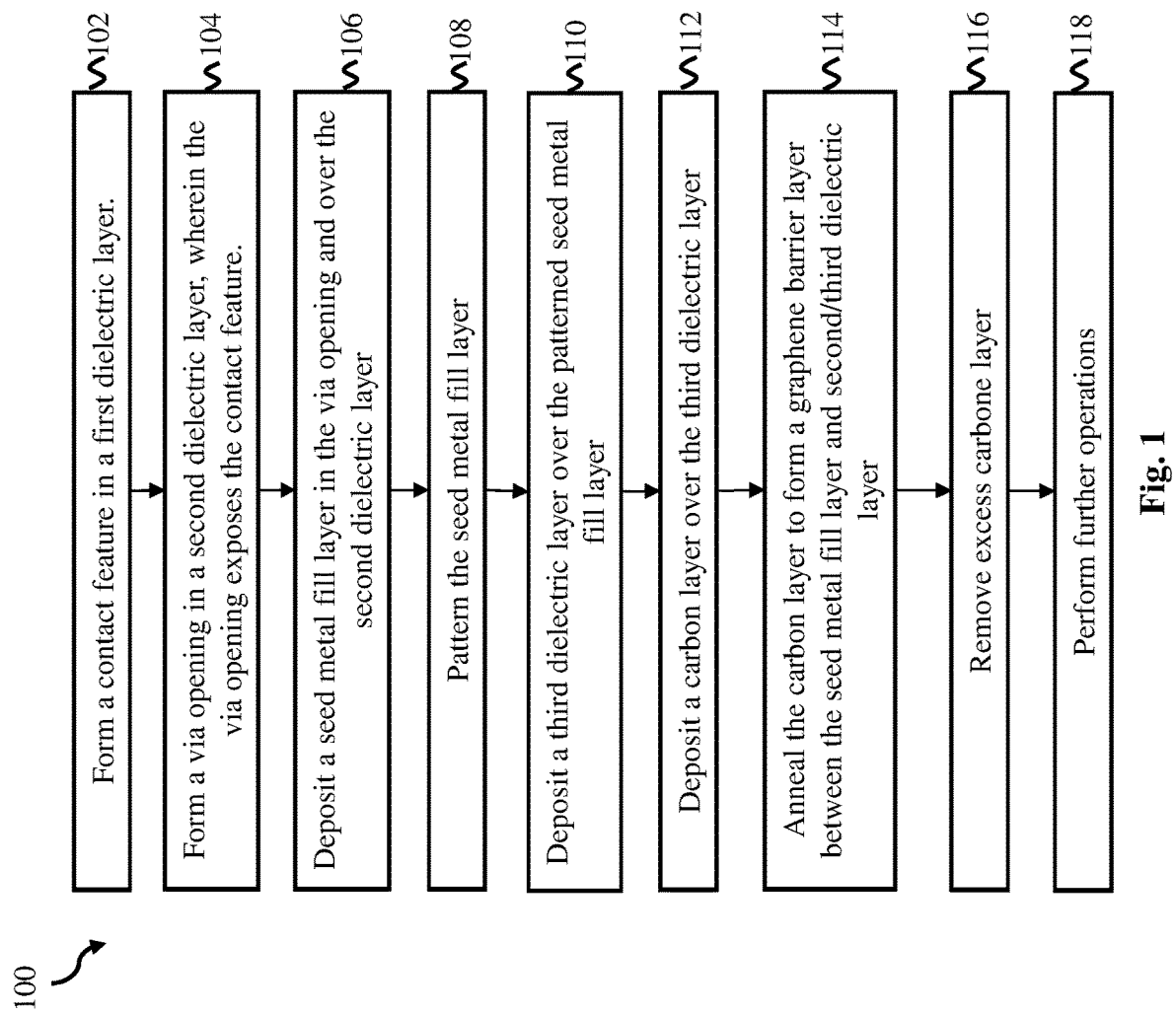
FIG. 1 is a flow chart of a method for fabricating an interconnect structure of a multilayer interconnect feature according to various aspects of the present disclosure.

The present disclosure relates generally to integrated circuit (IC) devices, and more particularly, to interconnect structures of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, IC fabrication processes are experiencing significant challenges. For example, advanced IC technology nodes require more compact interconnect structures, which require significantly reducing critical dimensions of conductive features (for example, widths and/or heights of vias and/or conductive lines of the interconnects and contacts). The reduced critical dimensions have led to significant increases in interconnect resistance, which can degrade IC device performance (for example, by increasing resistance-capacitance (RC) delay). This RC delay is further exacerbated by the increase of resistivity due to use of barrier layers at contact interfaces.

The present disclosure discloses methods of forming a graphene barrier layer to protect conductive features from oxygen diffusion. The present disclosure also discloses interconnect structures that include graphene barrier layers. In some embodiments, a carbon layer is formed over a barrier-free interconnect structure that include a contact feature formed of a seed metal. The seed metal has a solubility of carbon that is sensitive to temperature and surface properties that are catalytic to graphene formation. Carbon in the carbon layer is then allowed to diffuse through the conductive feature and form a graphene layer at the interface between the conduct feature and a surrounding dielectric layer. Because the graphene layer is both impenetrable by oxygen and more conductive than conventional barrier layer materials, the graphene layer at the interface may serve as a superior barrier layer and alleviate RC delay.

FIG. 1 illustrates a flow chart of a method 100 for fabricating an interconnect structure of a semiconductor device according to various aspects of the present disclosure. FIG. 1 will be described below in conjunction with FIGS. 2-9, which are fragmentary cross-sectional views of an interconnect structure of a semiconductor device at various stages of fabrication according to method 100 in FIG. 1. Additional steps can be provided before, during, and after method 100, and some of the steps described can be moved, replaced, or eliminated for additional embodiments of method 100. Additional features can be added in the interconnect structure depicted in FIGS. 2-9, and some of the features described below can be replaced, modified, or eliminated in other embodiments of the interconnect structure.

Figure 2:
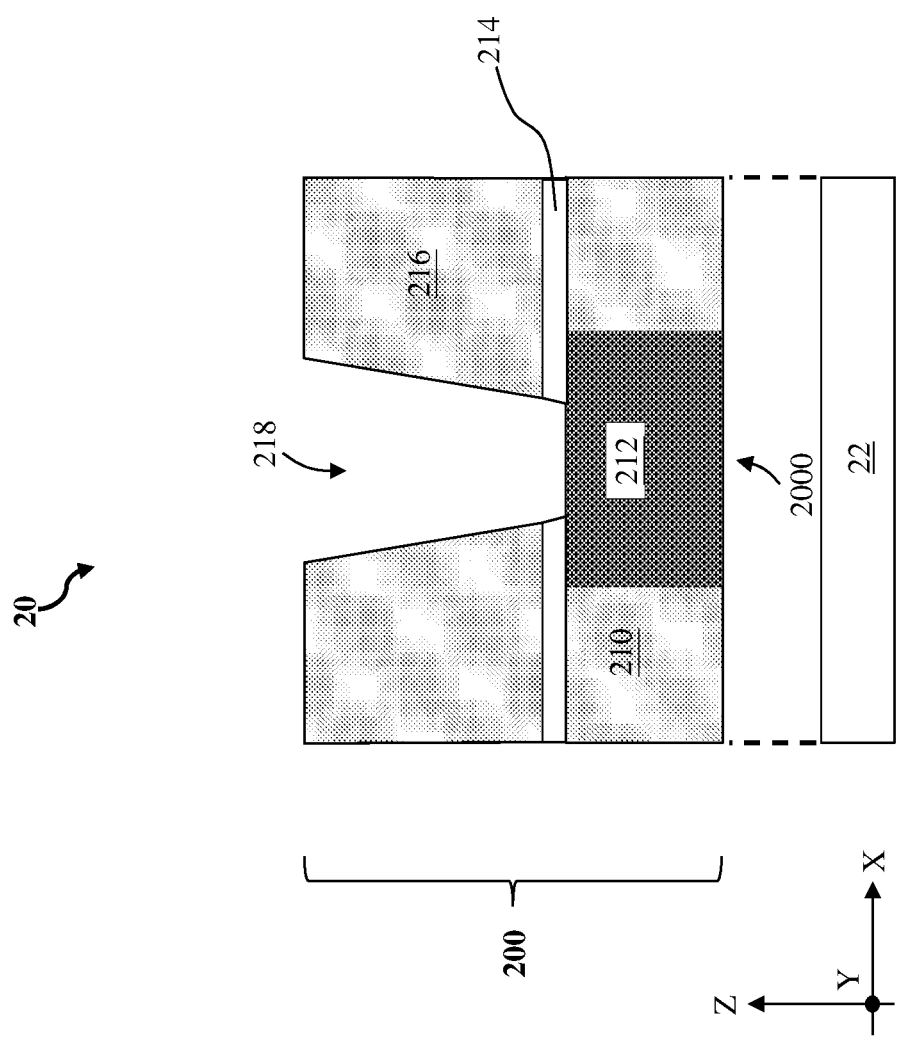
FIGS. 2-9 are fragmentary cross-sectional views of an interconnect structure of a semiconductor device at various stages of fabrication, according to various aspects of the present disclosure.

Referring to FIGS. 1 and 2, the method 100 includes a block 102 where a contact feature, such the first contact feature 2000, is formed in a first dielectric layer 210 of an interconnect structure 200 in a semiconductor device 20 to be formed on a workpiece. It is noted that before the semiconductor device 20 is fully formed, the semiconductor device 20 may be referred to as the workpiece. The first dielectric layer 210 may be an interlayer dielectric (ILD) layer and may therefore be referred to as the first ILD layer 210 as well. The semiconductor device 20 can be included in a microprocessor, a memory, and/or other IC device. In some implementations, the semiconductor device 20 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 2 has been simplified for the sake of clarity to better understand the inventive concepts of the present disclosure. Additional features can be added in the semiconductor device 20, and some of the features described below can be replaced, modified, or eliminated in other embodiments of the semiconductor device 20.

The semiconductor device 20 (or the workpiece) includes a substrate (wafer) 22. In the depicted embodiment, substrate 22 includes silicon. Alternatively or additionally, substrate 22 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 22 includes one or more group III-V materials, one or more group II-IV materials, or combinations thereof. In some implementations, substrate 22 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 22 can include various doped regions (not shown) configured according to design requirements of semiconductor device 20, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 22 includes doped regions formed with a combination of p-type dopants and n-type dopants. The various doped regions can be formed directly on and/or in substrate 22, for example, providing a p-well structure, an n-well structure, a dual-well structure, a raised structure, or combinations thereof. An ion implantation process, a diffusion process, and/or other suitable doping process can be performed to form the various doped regions. For simplicity, the substrate 22 is not illustrated in FIGS. 3-9.

An isolation feature(s) (not shown) is formed over and/or in substrate 22 to isolate various regions, such as various device regions, of semiconductor device 20. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 22 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excess insulator material and/or planarize a top surface of isolation features. In some embodiments, STI features include a multi-layer structure that fills the trenches, such as a silicon nitride layer disposed over an oxide liner layer.

While not shown, various gate structures are disposed over the substrate 22 and one or more of them interpose a source region and a drain region, where a channel region is defined between the source region and the drain region. The one or more gate structures engage the channel region, such that current can flow between the source/drain regions during operation. In some implementations, gate structures are formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device 20. In some implementations, metal gate stacks include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Epitaxial source features and epitaxial drain features (referred to as epitaxial source/drain features) may be disposed in source/drain regions of substrate 22. Gate structure and epitaxial source/drain features form a portion of a transistor of the semiconductor device 20. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes are performed to activate dopants in epitaxial source/drain features of the semiconductor device 20.

In some implementations, silicide layers are formed on epitaxial source/drain features. In some implementations, silicide layers are formed by depositing a metal layer over epitaxial source/drain features. The metal layer includes any material suitable for promoting silicide formation, such as nickel, platinum, palladium, vanadium, titanium, cobalt, tantalum, ytterbium, zirconium, other suitable metal, or combinations thereof. The semiconductor device 20 is then heated (for example, subjected to an annealing process) to cause constituents of epitaxial source/drain features (for example, silicon and/or germanium) to react with the metal. The silicide layers thus include metal and a constituent of epitaxial source/drain features (for example, silicon and/or germanium). In some implementations, the silicide layers include nickel silicide, titanium silicide, or cobalt silicide. Any un-reacted metal, such as remaining portions of the metal layer, may be selectively removed by any suitable process, such as an etching process.

The interconnect structure 200 is disposed over substrate 22. The interconnect structure 200 may electrically couple various devices (for example, transistors, resistors, capacitors, and/or inductors) and/or components (for example, gate structures and/or source/drain features) of the semiconductor device 20, such that the various devices and/or components can operate as specified by design requirements of the semiconductor device 20. The interconnect structure 200 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers the interconnect structure 200. During operation, the interconnect features are configured to route signals between the devices and/or the components of the semiconductor device 20 and/or distribute signals (for example, clock signals, voltage signals, and/or ground signals) to the devices and/or the components of the semiconductor device 20. Though the interconnect structure 200 is depicted with a given number of dielectric layers and conductive layers, the present disclosure contemplates the interconnect structure 200 having more or less dielectric layers and/or conductive layers.

Referring still to FIG. 2, the interconnect structure 200 includes one or more dielectric layers (i.e. ILD layers), such as the first dielectric layer 210 and other dielectric layers over the first dielectric layer 210. These dielectric layers include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some instances, the ILD layers are formed of low-k dielectric materials with a dielectric constant between about 1 and about 3.8.

At block 102 of the method 100, the first contact feature 2000 is formed in the first dielectric layer 210. The first contact feature 2000 may represent a BEOL contact feature and may be a bottom-most BEOL contact feature that interfaces an MEOL device-level contact, such as a gate contact electrically coupled to a gate structure and a source/drain contact electrically coupled to the epitaxial source/drain feature. In some embodiments, the first contact feature 2000 may include a metal fill layer 212 that is lined by a barrier layer and/or a liner such that the metal fill layer 212 is separated from the first dielectric layer 210 by the barrier layer and/or liner. In those implementations, the barrier layer may be formed of Ta, TaN, TaC, Ti, TiN, TiC, and other suitable material that can block oxygen diffusion. The liner may be formed of suitable metal, metal nitride, or metal carbide, such as Co, CoN and RuN to enhance adhesion of the metal fill layer in the first contact feature 2000. The metal fill layer 212 may be formed of any suitable conductive material, such as tungsten (W), nickel (Ni), iridium (Jr), osmium (Os), gold (Au), palladium (Pd), platinum (Pt), silver (Ag), tantalum (Ta), titanium (Ti), aluminum (Al), copper (Cu), cobalt (Co), tantalum nitride (TaN), titanium nitride (TiN), ruthenium (Ru), or alloys thereof. In some embodiments, formation of the first contact feature 2000 may include patterning the first dielectric layer 210 to form an opening. Patterning the first dielectric layer 210 can include lithography processes and/or etching processes. In some implementations, the lithography processes include forming a resist layer over the first dielectric layer 210, exposing the resist layer to pattern radiation, and developing the exposed resist layer, thereby forming a patterned resist layer that can be used as a masking element for etching the opening in the first dielectric layer 210.

Thereafter, the opening is filled with the barrier layer, the liner and the metal fill layer 212. The barrier layer in the first contact feature 2000 may be deposited using atomic layer deposition (ALD), chemical vapor deposition (CVD), or electroless deposition (ELD) and may be formed to a thickness between about 0.5 nm and about 5 nm. The liner in the first contact feature 2000 may be deposited using ALD, CVD, ELD, or physical vapor deposition (PVD) and may be formed to a thickness between about 0.5 nm and 3 nm. The metal fill layer 212 may be deposited using PVD, CVD, ALD, electroplating, ELD, or other suitable deposition process, or combinations thereof. Thereafter, any excess material(s) can be removed by a planarization process, such as a CMP process, thereby planarizing top surfaces of the first dielectric layer 210, the barrier layer, the liner, and the metal fill layer 212. As illustrated in FIG. 2, one or both the barrier layer and the liner of the first contact feature 2000 may be omitted. For example, in some instances, the barrier layer may be omitted if the metal fill layer 212 is formed of tungsten, ruthenium, or other material that is less susceptible to oxidation. For another example, when the adhesion between the barrier layer and the metal fill layer 212 is satisfactory, the liner may be omitted. In other instances, both the barrier layer and the liner are omitted.

After the top surfaces of the first dielectric layer 210, the barrier layer, the liner, and the metal fill layer 212 are planarized, a contact etch stop layer (CESL) 214 may be deposited over the first dielectric layer 210 and a second dielectric layer 216 may be deposited over the CESL 214. The second dielectric layer 216 may be formed using materials and processes similar to those used for forming the first dielectric layer 210 and is not described further here. The CESL 214 may have a composition different from that of the first dielectric layer 210 or that of the second dielectric layer 216. For example, the material of the first dielectric layer 210 is different than the material of the CESL 214. In some embodiments, the CESL 214 includes silicon and nitrogen, such as silicon nitride or silicon oxynitride, and has a dielectric constant greater than the dielectric constant of the first dielectric layer 210. The CESL 214 may be formed by a suitable deposition process, such as CVD, PVD, ALD, HDPCVD, MOCVD, RPCVD, PECVD, LPCVD, ALCVD, APCVD, other suitable methods, or combinations thereof. In some implementations, the CESL 214 may be formed by a flowable CVD (FCVD) process that includes, for example, depositing a flowable material (such as a liquid compound) over substrate 22 and converting the flowable material to a solid material by a suitable technique, such as thermal annealing and/or ultraviolet radiation treating. Subsequent to the deposition of the CESL 214, a CMP process and/or other planarization process is performed to provide a planar top surface.

Referring still to FIGS. 1 and 2, the method 100 includes a block 104 where and a via opening 218 may be formed in the second dielectric layer 216 and through the CESL 214. In some representative implementations shown in FIG. 2, the first contact feature 2000 is exposed in the via opening 218. The formation of the via opening 218 may be performed by a suitable wet etch or dry etch process. For example, a suitable dry etch process may be an ion beam etching (IBE) process with an IBE power level between about 100V and about 2000V, a beam angle between about 0° and about 70°, and an inert gas selected from helium, neon, argon, krypton, or xenon. Another suitable dry etch process may be an inductively coupled plasma-reactive ion etching (ICP-RIE or RIE-ICP) process, with a transformer coupled plasma power between about 100 W and about 1500 W, a bias level between about 0 V and about 300 V, and one or more organic gas species, such as acetic acid ($CH_3COOH$), methanol ($CH_3OH$), or ethanol ($C_2H_5OH$). Yet another suitable dry etch process may be an RIE-ICP process, with a transformer coupled plasma (TCP) power between about 100 W and about 1500 W, a bias voltage between about 0 V and about 500 V, a fluorocarbon gas, such as tetrafluoromethane ($CF_4$), trifluoromethane ($CHF_3$), difluoromethane ($CH_2F_2$), perfluorocyclobutane ($C_4F_8$), hexafluoro butadiene ($C_4F_6$), along with nitrogen, oxygen, or argon. Still another suitable dry etch process may be an RIE process, with TCP power level between about 100 W and about 2000 W, a bias voltage between about 0 V and about 500 V, a halogen or halocarbon compound such as chlorine ($Cl_2$), chlorosilane ($SiCl_4$), chloroborane ($BCl_3$), fluorocarbon (such as $CF_4$, $CHF_3$, $CH_2F_2$, $C_4F_8$, $C_4F_6$), along with nitrogen, oxygen, or argon. A suitable wet etch process may include use of one or more wet clean (wet etchant) components and one or more inhibitor components. Examples of the wet clean components include Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl) benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl)amine, Tris(2-ethylhexyl)amine, (4-Isothiocyanatophenyl)(3-methylphenyl)amine, Poly(ethylene glycol) methyl ether amine, Poly(ethylene glycol) diamine, Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, general acid, or a combination thereof. Examples of the inhibitor components include 1-Chlorobenzotriazole, 5-Chlorobenzotriazole, 5-Methyl- 1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, the like, or a combination thereof.

Figure 3:
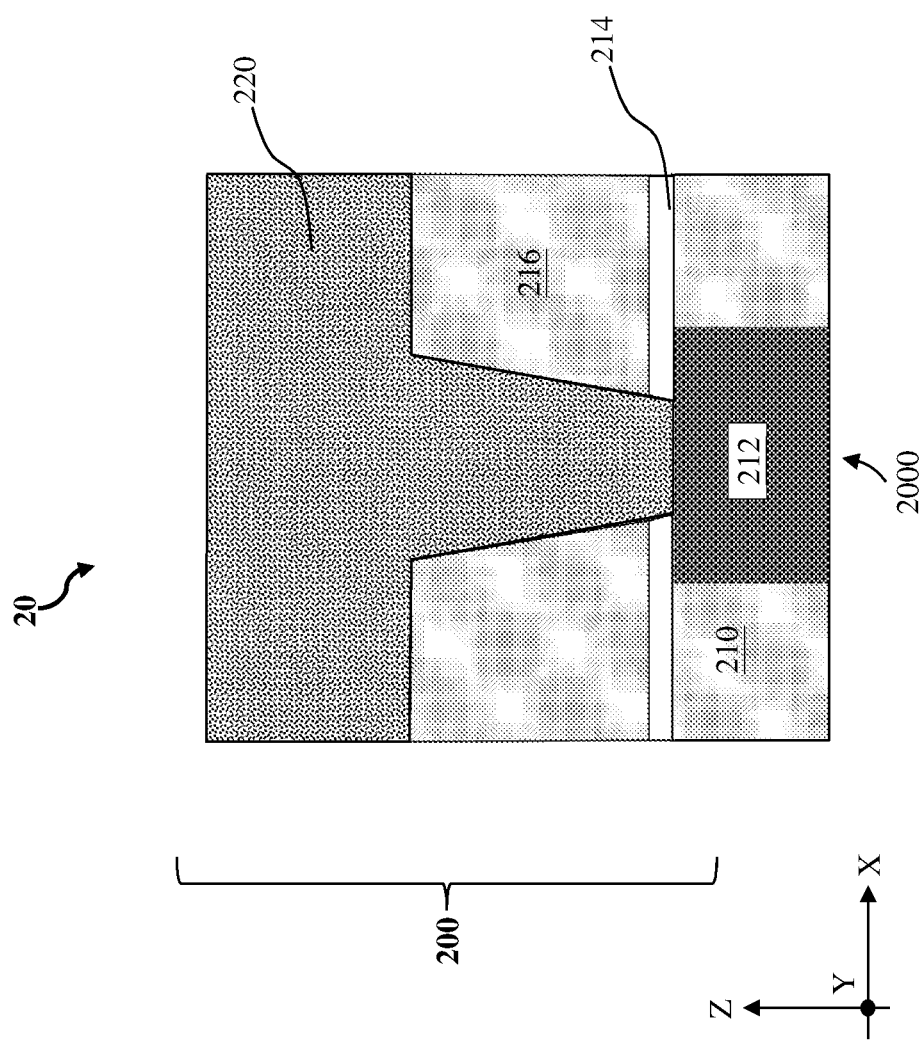

Referring to FIGS. 1 and 3, the method 100 may include a block 106 where a seed metal fill layer 220 may be formed over the exposed first contact feature 2000. In some embodiments, the seed metal fill layer 220 may have a composition different from that of the metal fill layer 212. The composition of the seed metal fill layer 220 is selected such that solubility of carbon in the seed metal fill layer 220 is sensitive to temperature. That is, a good seed metal fill layer 220 should have a threshold temperature, above which carbon is highly soluble in the seed metal fill layer 220 and below which carbon is substantially less soluble in the seed metal fill layer 220. The composition of the seed metal fill layer 220 is also selected such that the seed metal fill layer 220 includes at least one catalytic surface. In some embodiments, the seed metal fill layer 220 may include a transition metal or transition metal alloy that includes d-electrons (d-orbital electrons) that can interact with π-orbitals of graphene and a lattice plane that is similar to the hexagonal lattice of carbon atoms in a graphene layer. In some instances, the seed metal fill layer 220 may be formed of nickel (Ni), cobalt (Co), iron (Fe), copper (Cu), or copper-nickel alloy (cupronickel). In these example metals, nickel has a catalytic surface along the face-centered cubic (FCC) (111) plane, cobalt has a catalytic surface along the hexagonal close-packed (HCP) (0001) plane, iron has a catalytic surface along the FCC (110) plane, and copper has a catalytic surface along the FCC (110) plane. It has been observed that carbon atoms may diffuse through grain boundaries of the seed metal fill layer 220.

The seed metal fill layer 220 may be formed using ALD, CVD, PVD, plasma-enhanced CVD (PECVD), or plasma-enhanced ALD (PEALD). In some implementations, the seed metal fill layer 220 is formed using a technique that is less likely to introduce impurity in the seed metal fill layer 220. For example, the seed metal fill layer 220 may be formed using PVD, which uses a pure metal or metal alloy target and does not include use of any precursors that may be sources of impurities. Because the grain size of a graphene layer formed at the interface of the seed metal fill layer 220 (for example, the graphene barrier layer to be described below) may correspond to the grain size of the seed metal fill layer 220, control of the grain size of the seed metal fill layer 220 indirectly realizes control of the grain size of the graphene layer. To control the grain size of the graphene layer, the process to form the seed metal fill layer 220 may include parameters and aspects to control the grain size of the seed metal fill layer 220. For example, when the seed metal fill layer 220 is deposited using PVD, the PVD temperature may be selected to increase the grain size of the seed metal fill layer 220. For another example, block 106 may include an anneal step to increase the grain size of the seed metal fill layer 220. After the seed metal fill layer 220 is deposited, a planarization process, such as a CMP process, may be performed to provide a planar top surface.

Figure 4:
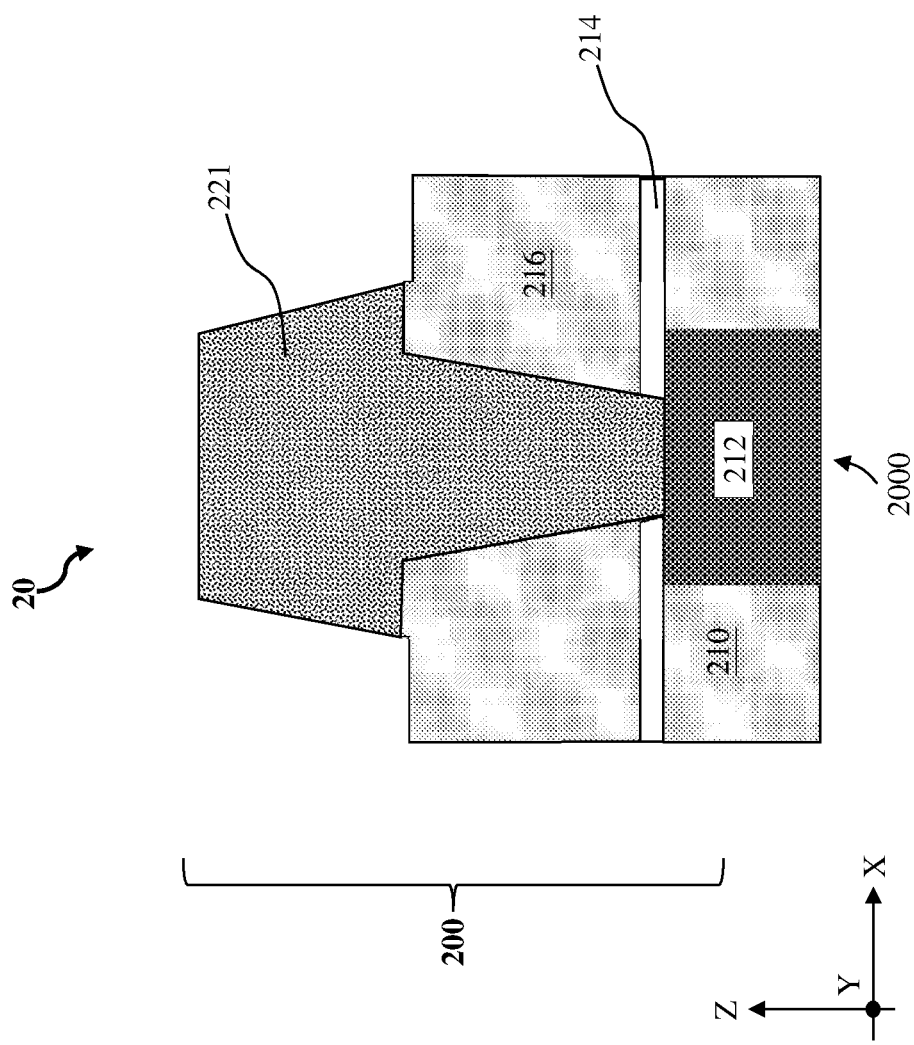

Referring to FIGS. 1 and 4, the method 100 includes a block 108 where the seed metal fill layer 220 is patterned to form the second contact feature 221. In some embodiments, the seed metal fill layer 220 are patterned using photolithography techniques. As an example, a hardmask layer is formed on the seed metal fill layer 220. The hardmask layer may be formed from an inorganic material, which may be a semiconductor nitride (such as silicon nitride), a semiconductor oxide (such as silicon oxide or aluminum oxide), the like, or combinations thereof, and may be formed by a deposition process such as CVD, ALD, or the like. In some embodiments, the hardmask layer is a multi-layer structure including a silicon nitride layer and a silicon oxide layer thereon. A photoresist is then formed and patterned on the hardmask layer. The photoresist may be formed by spin coating or the like and may be exposed to radiation reflected off or through a mask for patterning. The pattern of the photoresist corresponds to the second contact feature 221. The patterning forms openings through the photoresist. The patterned photoresist is then used in an etching process, such as an anisotropic wet or dry etch, to pattern the hardmask layer, with remaining portions of the hardmask layer forming the second conductive features. The photoresist may then be removed by an acceptable ashing or stripping process, such as using an oxygen plasma or the like. In some implementations, the etching process at block 108 is an RIE process that utilizes a plasma formed from halogen-based reactant gases, such as chlorine ($Cl_2$), tetrafluoromethane ($CF_4$), trifluoromethan ($CHF_3$), hydrochloric acid (HCl), and hydrobromic acid (HBr), or the like. In some of the implementations, argon (Ar), nitrogen ($N_2$) or oxygen ($O_2$) may be used in the RIE process as ion sources. The etching chemistry may be selected based on the composition of the seed metal fill layer 220. In embodiments where the seed metal fill layer 220 includes copper, operations at block 108 may be performed without halogen-based reactant gases to prevent copper corrosion. It has been observed that while copper possesses the highest conductivity out of metal selections, it has poor corrosion resistance when etched with halogen-based chemistry (such as fluorine-based, chlorine-based or bromine-based chemistry) and may exhibit poor conductivity when corroded. Instead, hydrogen, methane, or methanol may be used in the RIE process for etching copper seed metal fill layer 220 to prevent copper corrosion. The portion of the second contact feature 221 above the second dielectric layer 216 may be a metal line that extends along the y direction.

Figure 5:
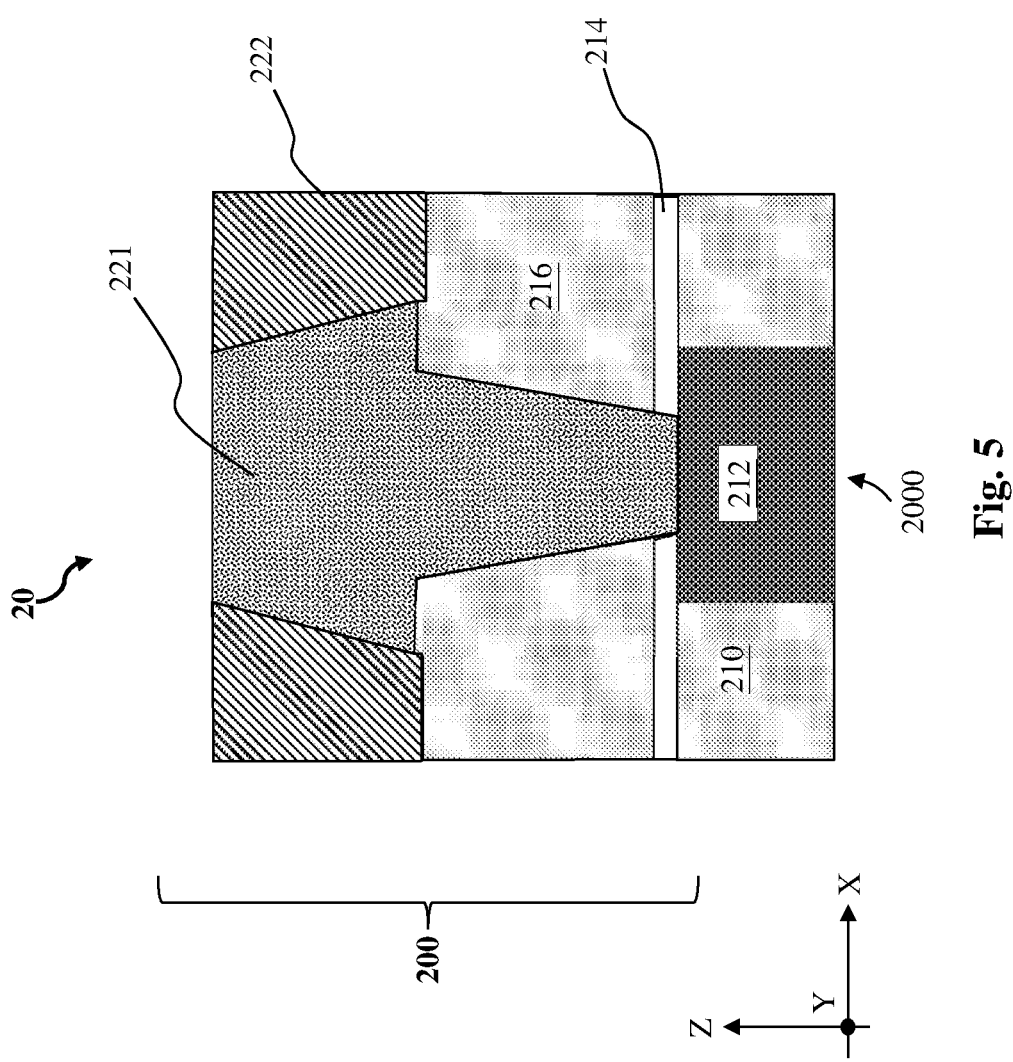

Referring now to FIGS. 1 and 5, the method 100 includes a block 110 where a third dielectric layer 222 is deposited over the patterned seed metal fill layer 220. The formation process and composition of the third dielectric layer 222 may be substantially similar to those of the first dielectric layer 210 and description thereof will not be repeated. After the third dielectric layer 222 is deposited, the interconnect structure 200 may be planarized to expose a top surface of the second contact feature 221 and provide a planar top surface.

Figure 6:
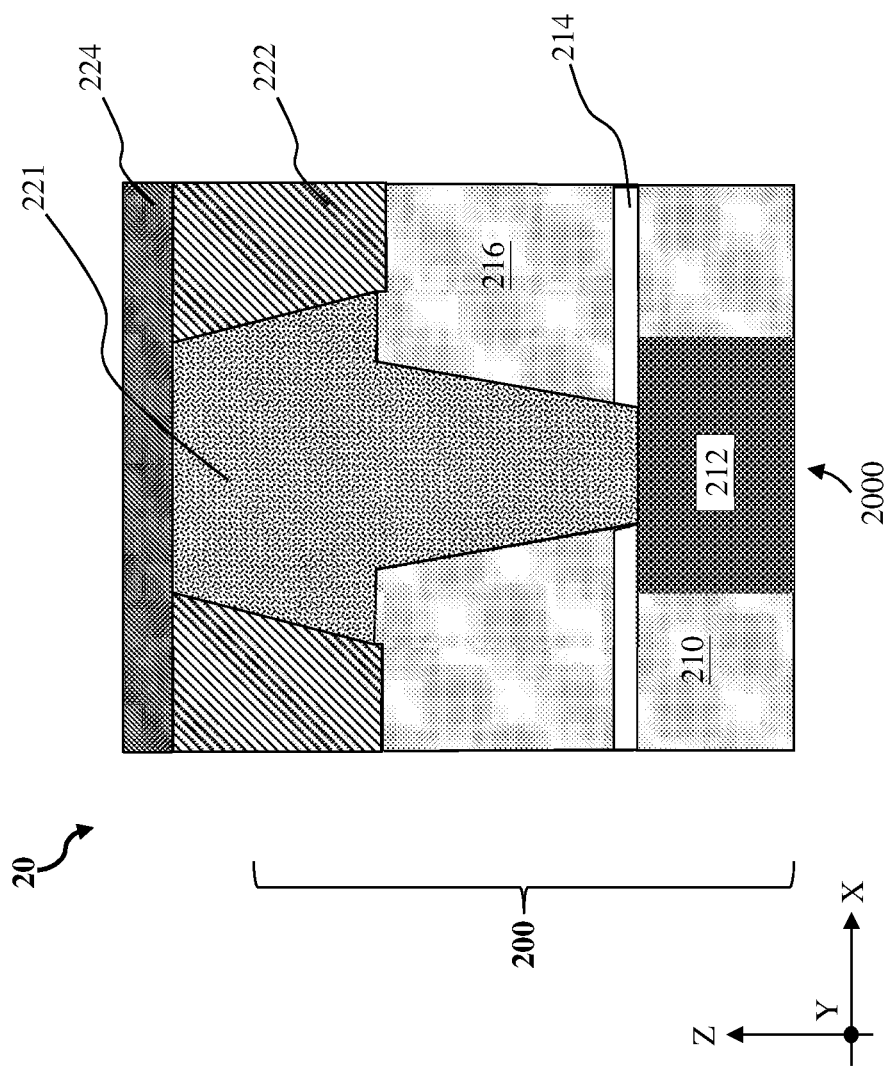

Referring now to FIGS. 1 and 6, the method 100 includes a block 112 where a carbon layer 224 is deposited over the third dielectric layer 222 and the seed metal fill layer 220. In some embodiments, the deposition process of the carbon layer 224 at block 112 is selected such that the carbon layer 224 is amorphous to facilitate out-diffusion of carbon atoms out of the carbon layer 224. That is, the deposition process of the carbon layer 224 at block 112 is selected to suppress short-range and long-range crystallinity of carbon layer 224. If the carbon layer 224 is crystalline or polycrystalline, carbon atoms may be less likely to diffuse from the carbon layer 224 into grain boundaries of the seed metal fill layer 220 and a higher anneal temperature may be needed for the anneal process at block 114 (to be described below). In some implementations, the carbon layer 224 may be deposited using PVD, ALD, CVD, PE-CVD, or PE-ALD using hydrocarbon precursors ($C_xH_y$) such as methane or ethene. To ensure that the carbon layer 224 formed at block 112 is amorphous, the carbon layer 224 may be formed at a temperature between about room temperature and about 400° C. In some instances, the carbon layer 224 may be deposited to a thickness between about 5 Å and about 100 Å.

Figure 7:
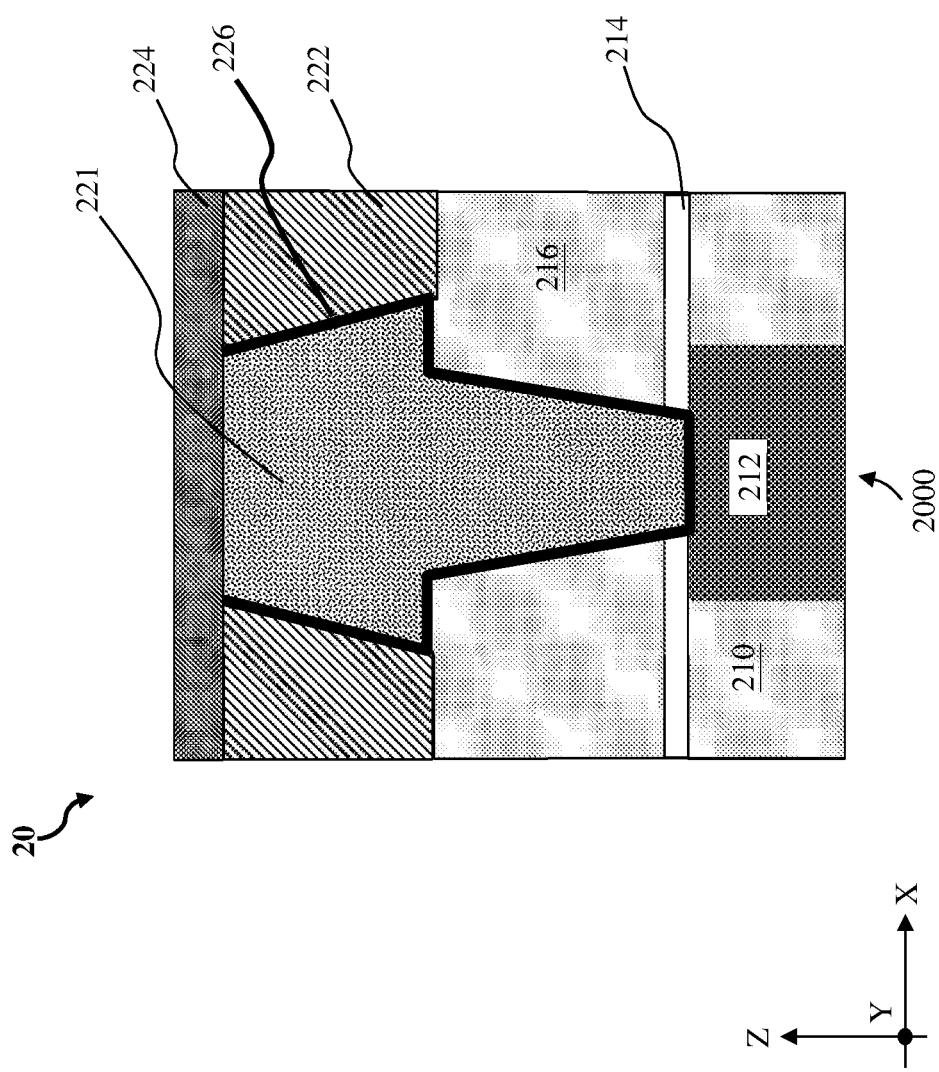

Referring now to FIGS. 1 and 7, the method 100 includes a block 114 where the carbon layer 224 is annealed to form a graphene barrier layer 226 between the second contact feature 221 and the second dielectric layer 216, between the second contact feature 221 and the third dielectric layer, between the second contact feature 221 and the CESL 214, and between the second contact feature 221 and the first contact feature 2000. In some embodiments, at block 114, the workpiece on which the semiconductor device 20 is formed is subject to an anneal process with an increased temperature (i.e. greater than room temperature) and an increased pressure (i.e. greater than the atmospheric pressure). In some implementations, the increased temperature may range between about 200° C. and about 1200° C. and the increased pressure may range between about 2 atmosphere (atm) and about 30 atm. At block 114, the second contact feature 221 in contact with the carbon layer 224 serves as a catalytic surface for the dissociation of carbon atoms from the carbon layer 224. The carbon atom from the carbon layer 224 then diffuses through the second contact feature 221, primarily through grain boundaries of the second contact feature 221. Once the carbon atom reaches the interfaces between the second contact feature 221 and neighboring layers, such as the third dielectric layer 222, the second dielectric layer 216, and the first contact feature 2000, the carbon atom starts to nucleate and form graphene at grain boundaries to form the graphene barrier layer 226. Additional carbon atoms may diffuse laterally along the interfacial junction of the hexagonal graphene plane and the catalytic surface of the second contact feature 221 to increase the lateral area of the graphene barrier layer 226. In some instances, some carbon atoms may remain in (or in some cases, be trapped at) the grain boundaries of the second contact feature 221 upon conclusion of the fabrication of the semiconductor device 20. In other instances, the grain boundaries of the second contact feature 221 may be substantially free of carbon atoms as they are allowed to diffuse through the second contact feature 221 to the interfaces between the second contact feature 221 and neighboring layers upon conclusion of the fabrication of the semiconductor device 20. As described above, the catalytic surface may be a FCC (111) plane, FCC (110) plane, or HCP (0001) plane of the second contact feature 221, which is formed from the seed metal fill layer 220. Depending on the conditions of the anneal process, the crystallinity of the carbon layer 224, the grain size of the seed metal fill layer 220, desired properties of the graphene barrier layer 226, and the properties of the seed metal fill layer 220, the anneal process may last between about 10 minutes and about 10 hours. In some implementations, the graphene barrier layer 226 formed using methods of the present disclosure includes a plurality layers of carbon atoms arranged in hexagonal lattices and has a thickness between about 3 Å and about 20 Å. In addition, the graphene barrier layer 226 formed at block 114 extends continuously from the interface between the third dielectric layer 222 and the second contact feature 221, to the interface between the second dielectric layer 216 and the second contact feature 221, and then to the interface between the first contact feature 2000 and the second contact feature 221. That is, the graphene barrier layer 226 extends along interfaces between the second contact feature 221 and a neighboring layer or structure, including the third dielectric layer 222, the second dielectric layer 216, and the first contact feature 2000. It has been observed that no graphene barrier layer 226 would be formed at an interface that is free of the second contact feature 221. For example, the interface between the second dielectric layer 216 and the third dielectric layer 222 is free of the graphene barrier layer 226.

In some embodiments, because the carbon layer 224 is deposited over the second contact feature 221 and allowed to diffuse through different paths through the second contact feature 221 to reach interfaces with the third dielectric layer 222, the second dielectric layer 216, and the first contact feature 2000. The amounts of carbon atoms at different interfaces for graphene formation may vary and may result in non-uniform thicknesses of the graphene barrier layer 226 at different interfaces. The graphene barrier layer 226 may have a first portion at the interface between the second contact feature 221 and the third dielectric layer 222, a second portion at the interface between the second contact feature 221 and the second dielectric layer 216, and a third portion at the interface between the second contact feature 221 and the first contact feature 2000. In some implementations, the first, second and third portions have the same number of graphene layers and the same thickness. In other implementations, the first, second and third portions have the different numbers of graphene layers and different thicknesses. For example, the first portion has a first number (N1) of graphene layers and a first thickness (T1), the second portion has a second number (N2) of graphene layers and a second thickness (T2), and the third portion has a third number (N3) of graphene layers and a third thickness (T3). The first number (N1) is greater than the second number (N2) and the second number (N2) is greater than the third number (N3). The first thickness (T1) is greater than the second thickness (T2) and the second thickness (T2) is greater than the third thickness (T3).

Figure 8:
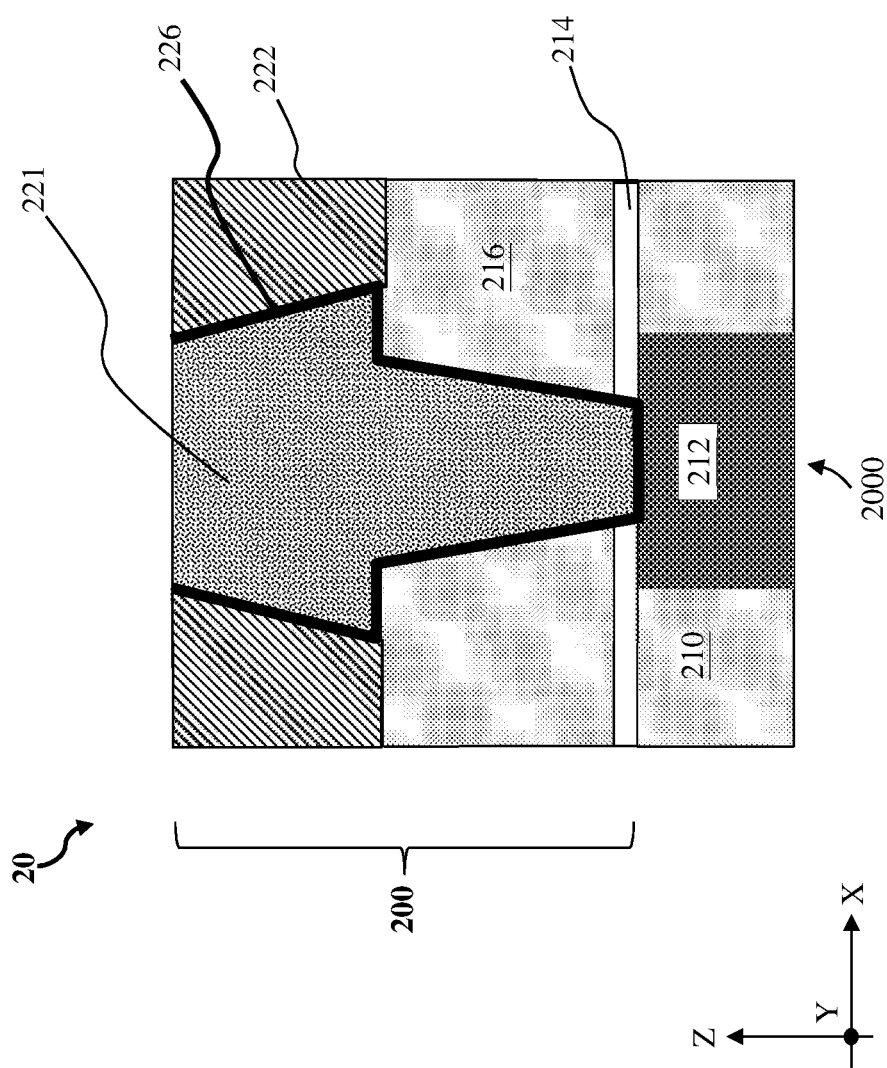

Referring now to FIGS. 1 and 8, the method 100 includes a block 116 where excess carbon layer 224 over the second contact feature 221 and the third dielectric layer 222 is removed. In some embodiments, the carbon layer 224 at block 112 is deposited with a surplus to ensure sufficient supply of carbon atoms at block 114. In those embodiments, the excess carbon layer 224 that is not consumed at block 114 may be removed using, a suitable wet etch process, a suitable dry etch process, a combination thereof, or a suitable planarization process. The removal process at block 116 is selected such that the graphene barrier layer 226 is not damaged.

Figure 9:
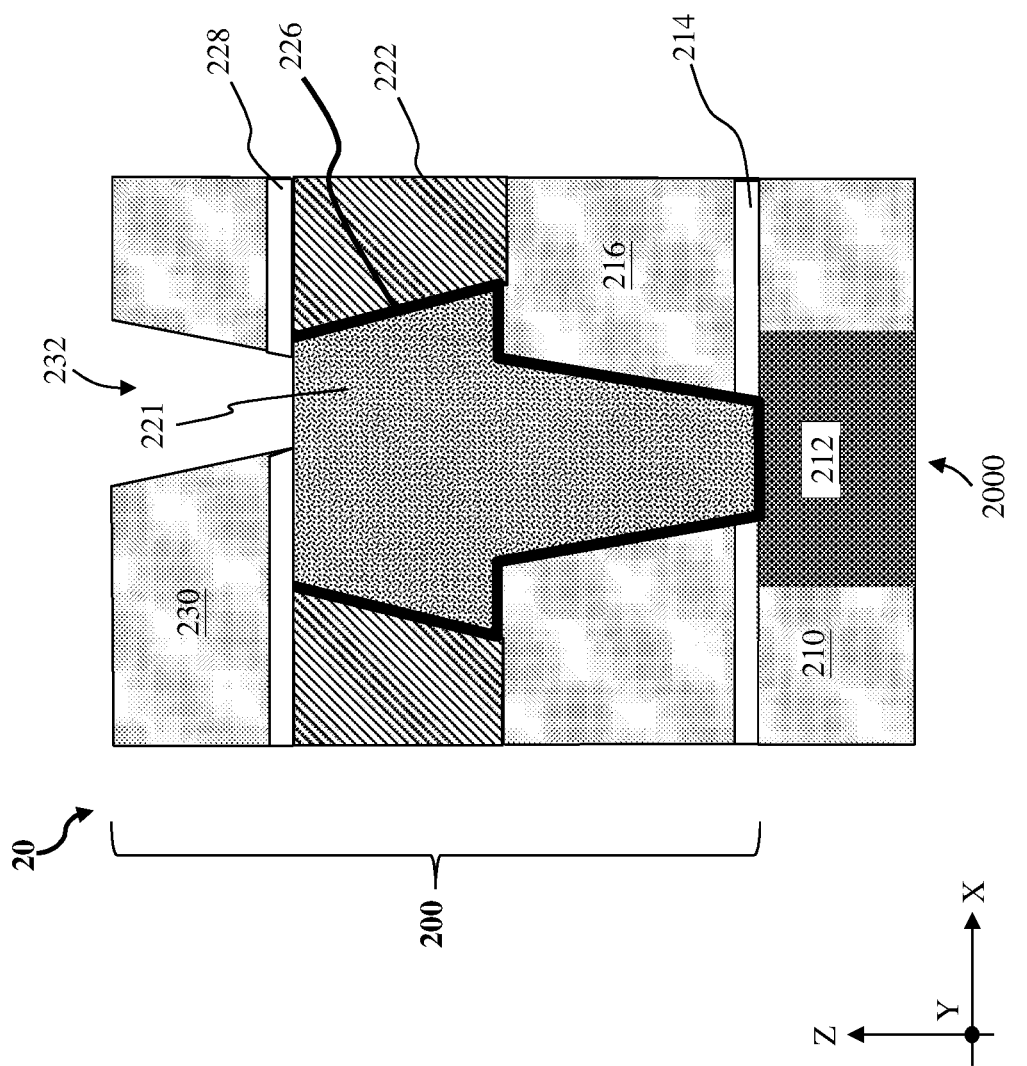

Referring now to FIGS. 1 and 9, the method 100 includes a block 118 where further operations are performed. In some embodiments, the further processes may include processes for forming additional interconnect layers of the interconnect structure 200. For example, such further processes may include deposition of another CESL 228, deposition of another dielectric layer 230, formation of a via opening 232 through the CESL 228 and the dielectric layer 230, and deposition of a metal fill layer in the via opening 232. The materials and the formation processes of these features are similar to their counterparts described above and descriptions thereof will not be repeated here.

In embodiments represented in FIG. 9, the interconnect structure 200 of the present disclosure includes several advantageous features as compared to a conventional interconnect structure having a conventional barrier layer. For example, the graphene barrier layer 226 of the interconnect structure 200 is disposed at the interface between the second contact feature 221 and the first contact feature 2000. In some instances, given the same thickness and along the conduction paths, the conductivity of the graphene barrier layer 226 is greater than that of conventional metal nitride barrier layers. Therefore, implementation of the graphene barrier layer 226 may reduce the contact resistance, thereby reducing the RC delay. In addition, the graphene barrier layer 226 along sidewalls of the second dielectric layer 216 and the third dielectric layer 222 may also provide good current conduction paths. The graphene barrier layer 226 is also a better barrier layer than the conventional metal barrier layer. The π-electrons of the graphene hexagonal lattice make the graphene barrier layer 226 virtually impenetrable to oxygen, allowing the graphene barrier layer 226 to protect the second contact feature 221 against oxygen from the first dielectric layer 210 and the second dielectric layer 216.

Figure 10:
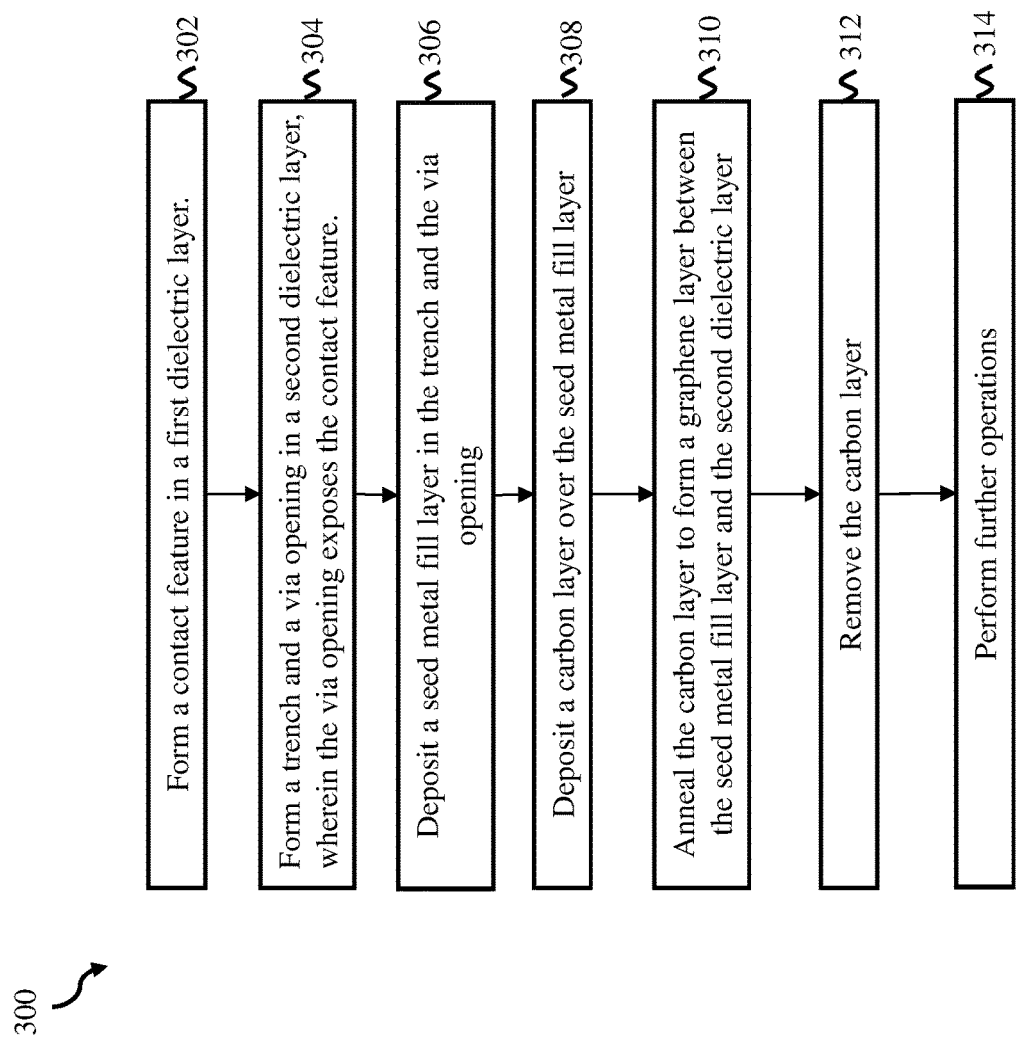
FIG. 10 is a flow chart of another method for fabricating an interconnect structure of a multilayer interconnect feature according to various aspects of the present disclosure.

FIG. 10 illustrates a flow chart of a method 300 for fabricating another interconnect structure of a semiconductor device according to various aspects of the present disclosure. FIG. 10 will be described below in conjunction with FIGS. 11-16, which are fragmentary cross-sectional views of another interconnect structure of a semiconductor device at various stages of fabrication according to method 300 in FIG. 10. Additional steps can be provided before, during, and after method 300, and some of the steps described can be moved, replaced, or eliminated for additional embodiments of method 300. Additional features can be added in the interconnect structure depicted in FIGS. 11-16, and some of the features described below can be replaced, modified, or eliminated in other embodiments of the interconnect structure. It is noted that methods 100 and 300 are separately described to demonstrate that methods according to the present disclosure may be applied to different interconnect structures that are formed following different processes. Both the methods 100 and 300 form a graphene barrier layer, such as the graphene barrier layer 226. Aspects of the method 300 that are described above with respect to the method 100 will not be repeated.

Figure 11:
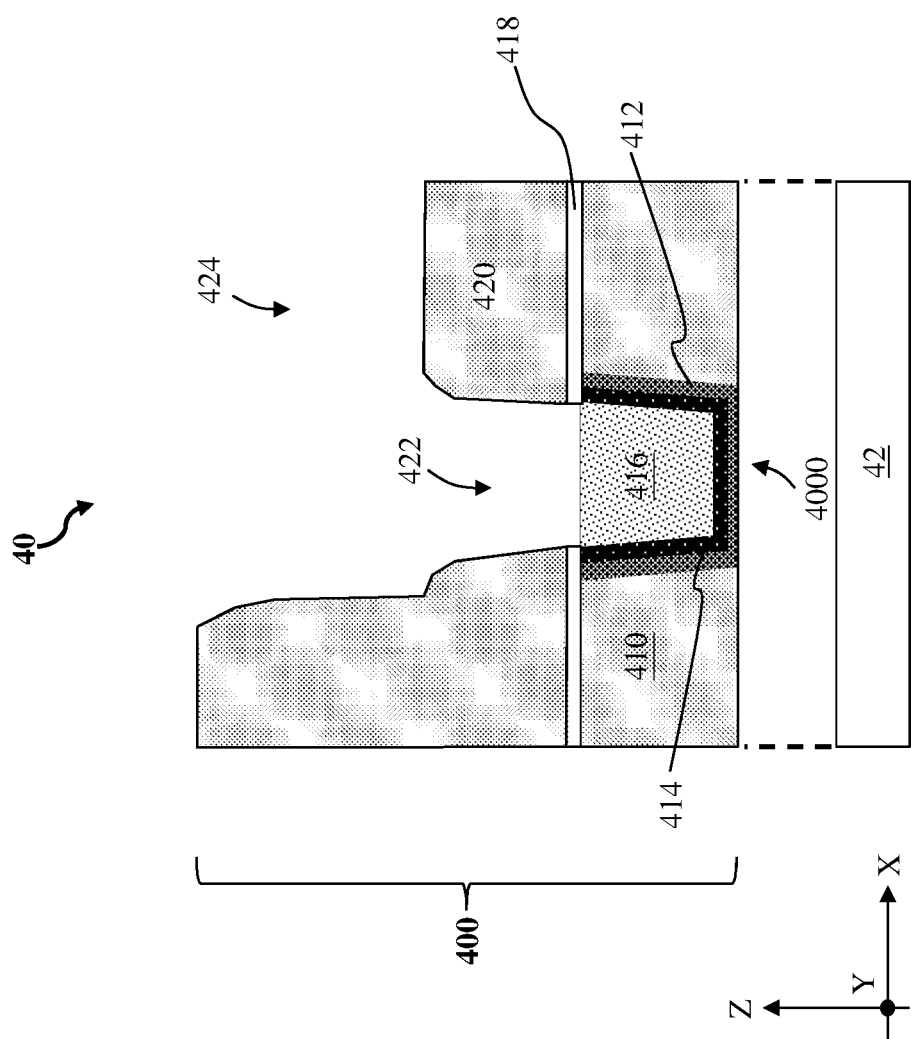
FIG. 11-16 are fragmentary cross-sectional views of an interconnect structure of a semiconductor device at various stages of fabrication, according to various aspects of the present disclosure.

Referring now to FIGS. 10 and 11, the method 300 includes a block 302 where a contact feature 4000 is formed in a lower dielectric layer 410 of an interconnect structure 400 in a semiconductor device 40 to be formed on a workpiece. The interconnect structure 400 may be an interconnect structure that is electrically coupled to an MEOL contact structure. The lower dielectric layer 410 may be an ILD layer and may therefore be referred to as a lower ILD layer 410. The semiconductor device 40 includes a substrate 42 and the interconnect structure 400 may include a contact etch stop layer (CESL) 418 over the lower dielectric layer 410. The semiconductor device 40, the lower dielectric layer 410, the CESL 418, and the substrate 42 may be similar to the semiconductor device 20, the first dielectric layer 210, the CESL 214, and the substrate 22, respectively and their compositions and formation processes will not be repeated here for brevity. In addition, for simplicity, the substrate 42 is not illustrated in FIGS. 12-16.

In some embodiments illustrated in FIG. 11, the contact feature 4000 may include a barrier layer 412, a liner 414, and a metal fill layer 416. The barrier layer 412, the liner 414 and the metal fill layer 416 are similar to the barrier layer, liner and the metal fill layer 212 described above and descriptions of their compositions and formation will not be repeated here. After deposition and planarization of the top surfaces of the lower dielectric layer 410, the barrier layer 412, liner 414 and the metal fill layer 416, the CESL 418 is deposited over the lower dielectric layer 410 and an upper dielectric layer 420 may be deposited over the CESL 418.

Referring still to FIGS. 10 and 11, the method 300 includes a block 304 where a via opening 422 and a trench 424 are formed in the upper dielectric layer 420 such that the via opening 422 exposes the contact feature 4000. In some embodiments, the trench 424 is larger than the via opening 422 in dimensions along the X direction and/or the Y direction. The trench 424 may be utilized to form a conductive line (or metal line) that extends along the X direction or the Y direction. In some representative implementations shown in FIG. 11, the contact feature 4000 is exposed through the via opening 422 in the bottom surface of the trench 424. In some embodiments, the via opening 422 and the trench 424 may be formed by dry etch, wet etch, or other suitable etching technique. The via opening extends through the upper dielectric layer 420 and the CESL 418.

Figure 12:
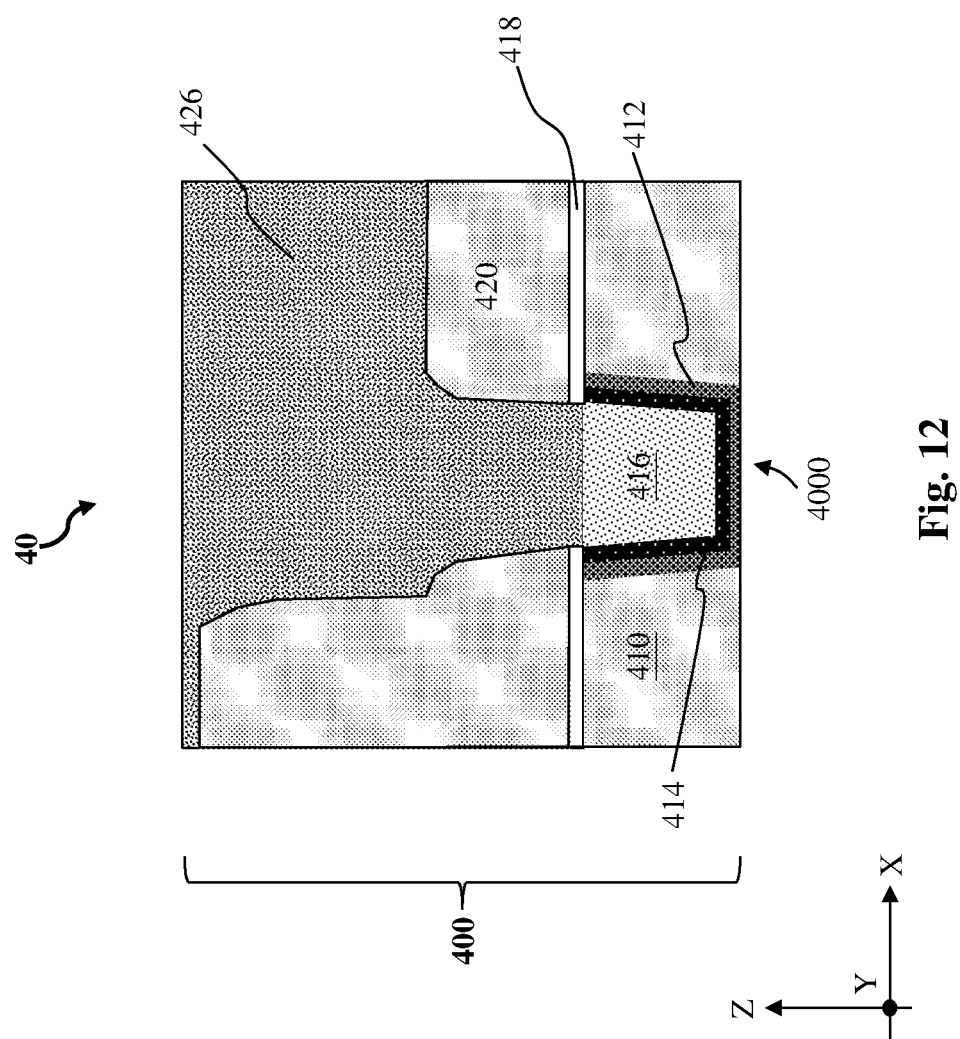

Referring now to FIGS. 10 and 12, the method 300 includes a block 306 where a seed metal fill layer 426 is formed in the via opening 422 and the trench 424. In some embodiments, the seed metal fill layer 426 may be formed by depositing metal in the via opening 422 and the trench 424 in a selective, bottom-up, or self-aligned manner. In that regard, the precursors and formation process of the seed metal fill layer 426 are selected such that the precursors of the metal selectively deposit on the metal surface of the exposed contact feature 4000 and the metal deposited in the via opening 422 thickens from the bottom up to fill the via opening 422 and the trench 424. The seed metal fill layer 426 may be formed of nickel (Ni), copper (Cu), cobalt (Co), iron (Fe), cupronickel, or alloys thereof. The portion of the seed metal fill layer 426 in the trench 424 functions as a metal line that may extend in the X or Y direction. The portion of the seed metal fill layer 426 in the via opening 422 functions as a contact via that electrically couples the contact feature 4000 to the metal line.

Figure 13:
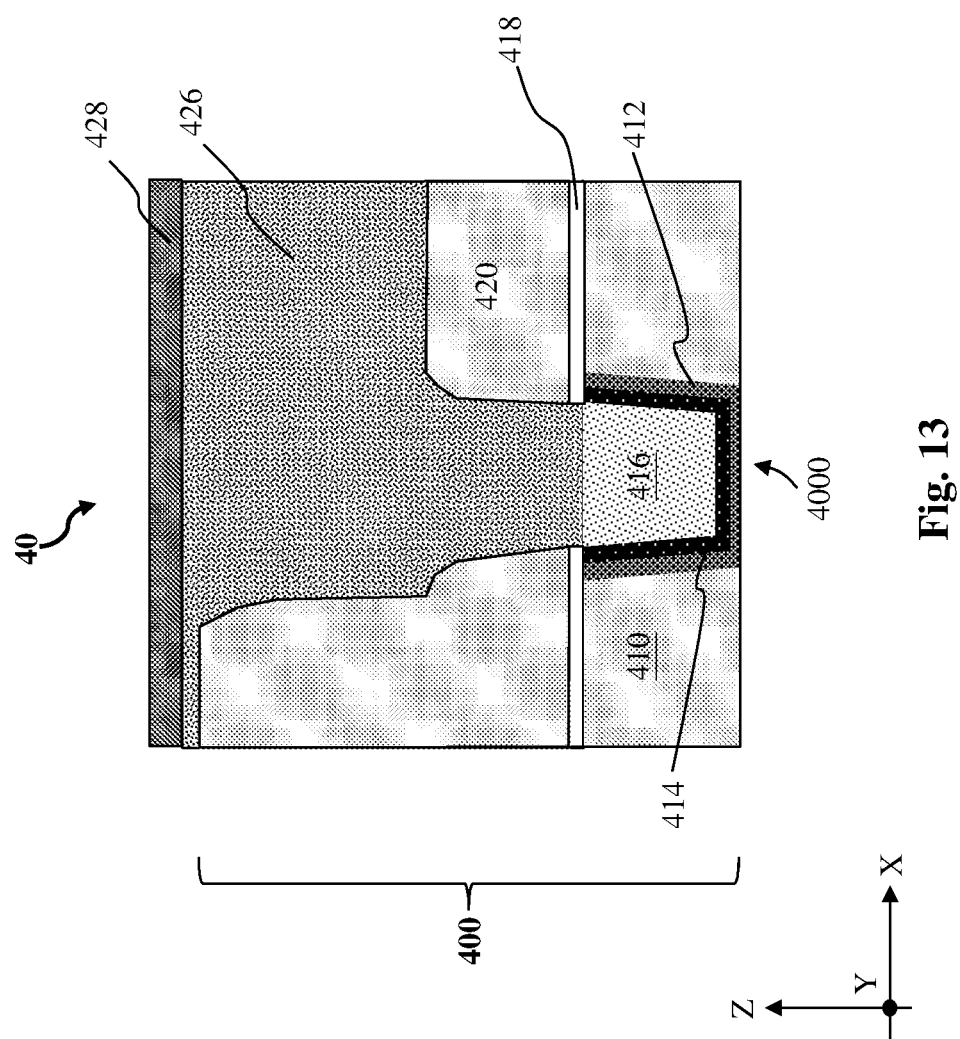

Referring now to FIGS. 10 and 13, the method 300 includes a block 308 where a carbon layer 428 is deposited over the seed metal fill layer 426. The seed metal fill layer 426 may or may not be planarized before the deposition of the carbon layer 428. The composition and the deposition process of the carbon layer 428 are similar to those of the carbon layer 224 and descriptions thereof will not be repeated here.

Figure 14:
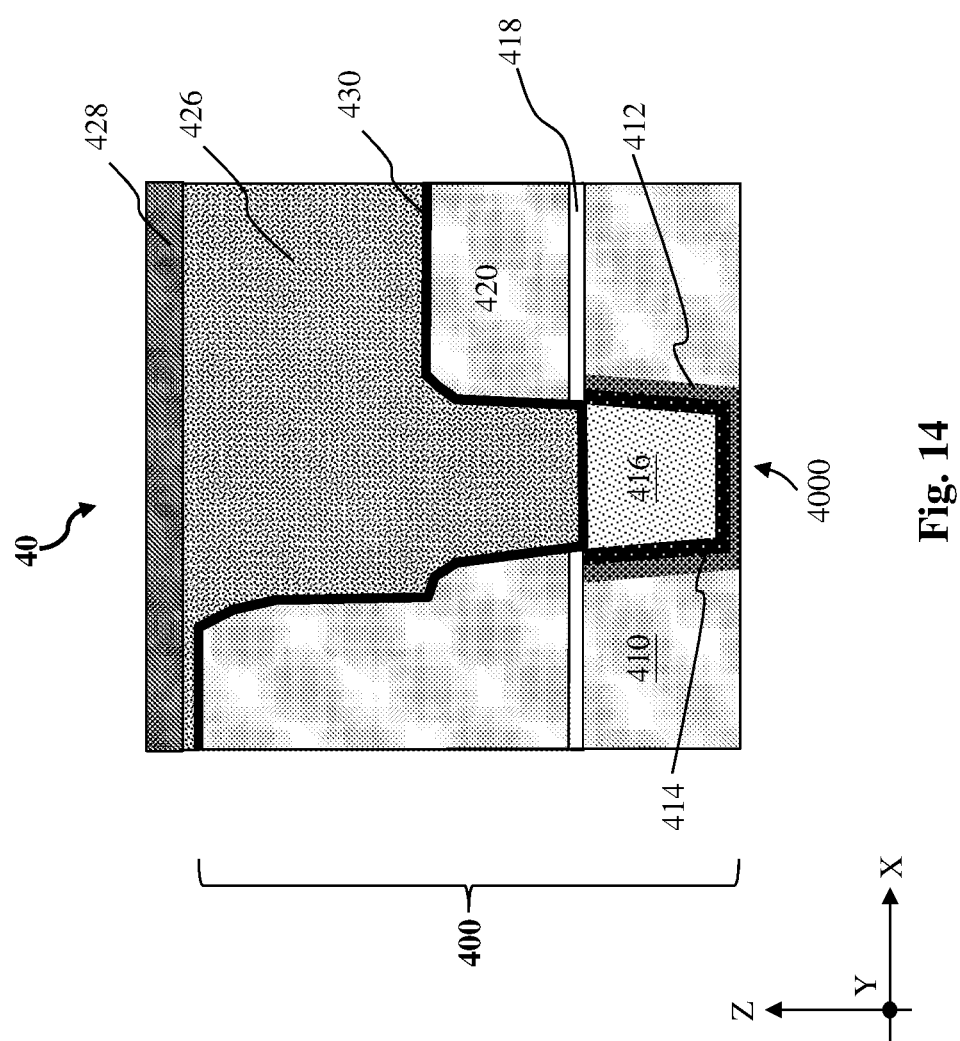

Referring now to FIGS. 10 and 14, the method 300 includes a block 310 where the carbon layer 428 is annealed to form a graphene barrier layer 430 between the seed metal fill layer 426 and the upper dielectric layer 420, between the seed metal fill layer 426 and the CESL 418, and between the seed metal fill layer 426 and the metal fill layer 416. The graphene barrier layer 430 is similar to the graphene barrier layer 226 and its description will not be repeated.

Figure 15:
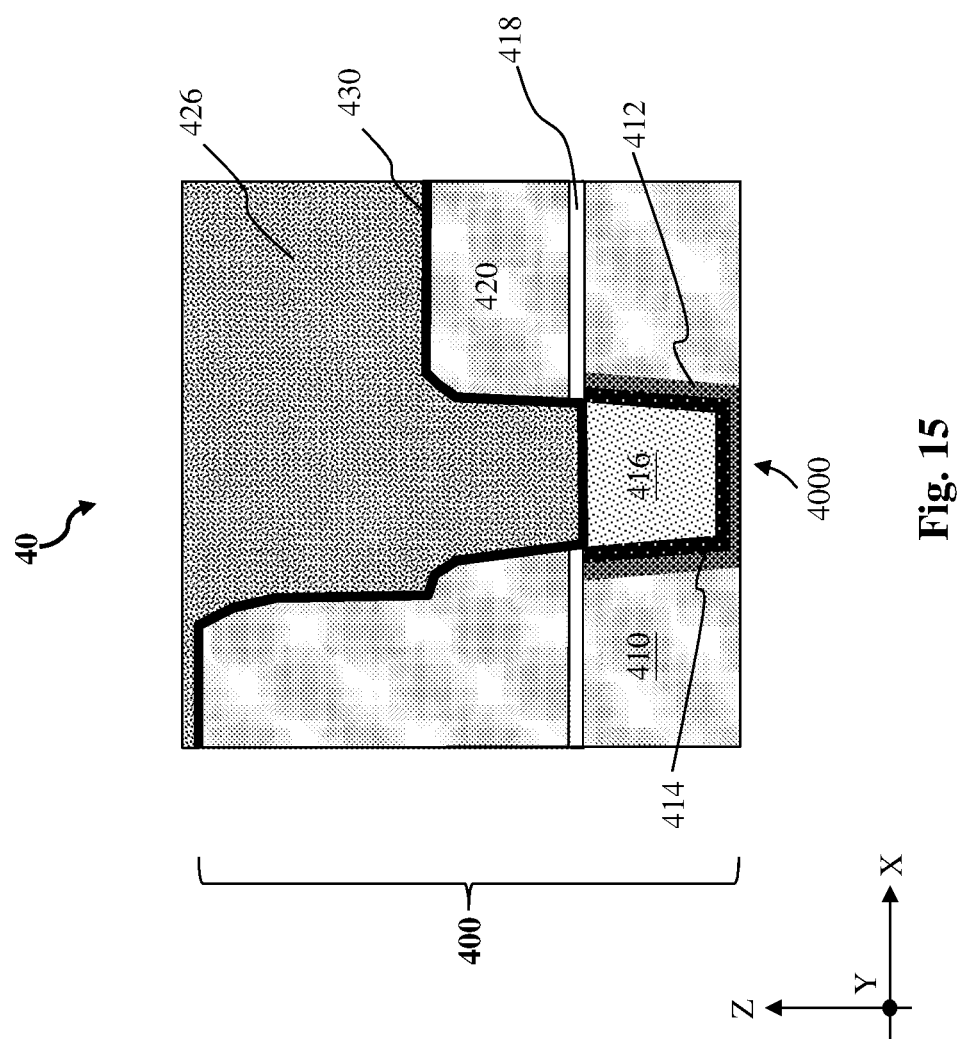

Referring now to FIGS. 10 and 15, the method 300 includes a block 312 where the carbon layer 428 is removed. In some embodiments, the carbon layer 428 at block 308 is deposited with a surplus to ensure sufficient supply of carbon atoms at block 310. In those embodiments, the excess carbon layer 428 that is not consumed at block 310 may be removed using, a suitable wet etch process, a suitable dry etch process, or a suitable planarization process.

Figure 16:
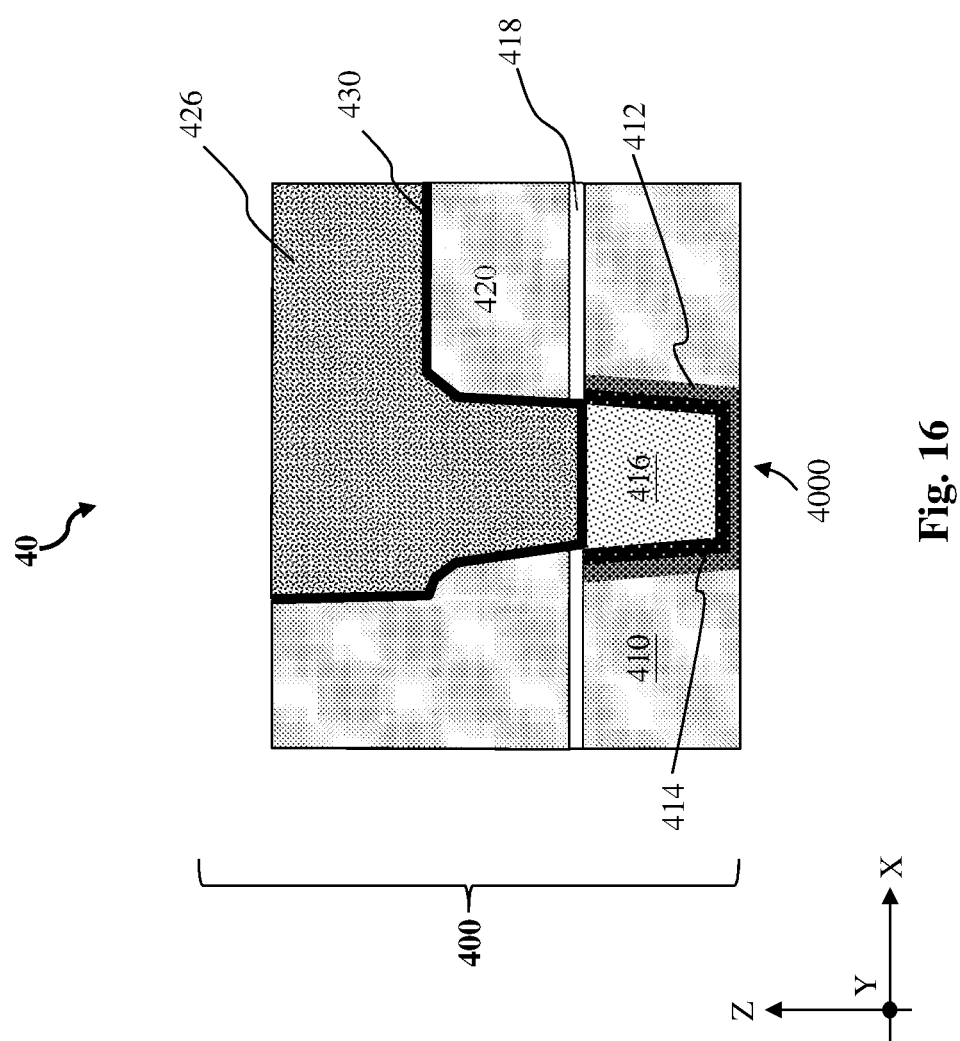

Referring now to FIGS. 10 and 16, the method 300 include a block 314 where further operations are performed. For example, as illustrated in FIG. 16, the workpiece may be subject to a planarization process, such as a CMP process, to remove excess seed metal fill layer 426 over the upper dielectric layer 420. After the top surface of the workpiece is planarized, further processes for forming additional interconnect layers of the interconnect structure 400 may be performed. For example, such further processes may include deposition of another CESL, deposition of another dielectric layer, formation of another via opening through the CESL and the dielectric layer, and deposition of another metal fill layer in the via opening. The materials and the formation processes of these features are similar to their counterparts described above and descriptions thereof will not be repeated here.

The interconnect structures and methods disclosed herein provide several benefits. In some embodiments, the present disclosure discloses methods of forming a graphene barrier layer to protect conductive features from oxygen diffusion. The present disclosure also discloses interconnect structures that include graphene barrier layers. In some embodiments, a carbon layer is formed over a barrier-free interconnect structure that include a contact feature formed of a seed metal. The seed metal has a solubility of carbon that is sensitive to temperature and surface properties that are catalytic to graphene formation. Carbon in the carbon layer is then allowed to diffuse through the conductive feature and form a graphene layer at the interface between the conduct feature and a surrounding dielectric layer. Because the graphene layer is both impenetrable by oxygen and more conductive than conventional barrier layer materials, the graphene layer at the interface may serve as a superior barrier layer and alleviate RC delay.

The present disclosure provides for many different embodiments. In one embodiment, an interconnect structure is provided. The interconnect structure includes a first contact feature in a first dielectric layer, a second dielectric layer over the first dielectric layer, a third dielectric layer over the second dielectric layer, a second contact feature extending through the second dielectric layer and the third dielectric layer, and a graphene layer between the second contact feature and the third dielectric layer.

In some embodiments, the second contact feature includes a contact via portion and a metal line portion, the contact via portion of the second contact feature is disposed within the second dielectric layer, and the metal line portion of the second contact feature is disposed within the third dielectric layer. In some implementations, the second contact feature is formed of a seed metal that includes a catalytic surface for graphene formation. In some embodiments, the second contact feature includes nickel, cobalt, iron, copper, or cupronickel. In some embodiments, the interconnect structure further includes carbon atoms disposed in grain boundaries of the second contact feature. In some instances, an interface between the second dielectric layer and the third dielectric layer is free of the graphene layer. In some implementations, the interconnect structure further includes an etch stop layer disposed between the first dielectric layer and the second dielectric layer and the graphene layer is disposed between the second contact feature and the etch stop layer. In some embodiments, the graphene layer has a thickness between about 3 Å and about 20 Å.

In another embodiment, an interconnect structure includes a first contact feature in a first dielectric layer, an etch stop layer over the first dielectric layer, a second dielectric layer over the etch stop layer, a second contact feature extending through the second dielectric layer and electrically coupled to the first contact feature, and a carbon layer between and in contact with the second contact feature and the first contact feature.

In some embodiments, the carbon layer includes a graphene layer. In some embodiments, the second contact feature is substantially free of carbon atoms. In some embodiments, the carbon layer includes a first portion disposed between the second contact feature and the second dielectric layer and a second portion disposed between the second contact feature and the first contact feature. The first portion has a first thickness and the second portion has a second thickness smaller than the first thickness. In some implementations, a dielectric constant of the etch stop layer is greater than dielectric constants of the first and second dielectric layers. In some instances, the second contact feature includes nickel, cobalt, iron, copper, or cupronickel.

In still another embodiment, a method is provided. The method includes forming a first contact feature in a first dielectric layer over a workpiece, forming a second dielectric layer over the first contact feature and the first dielectric layer, forming a via opening in the second dielectric layer to expose a portion of the first contact feature, depositing a seed metal layer in the via opening and over the second dielectric layer, patterning the seed metal layer to expose a portion of the second dielectric layer, depositing a third dielectric layer over the exposed portion of the second dielectric layer, depositing a carbon layer over the seed metal layer and the third dielectric layer, and annealing the workpiece to form a graphene layer between the seed metal layer and the third dielectric layer.

In some embodiments, the depositing of the seed metal layer includes depositing the seed metal layer using physical vapor deposition. In some embodiments, the annealing of the workpiece includes annealing the workpiece at a temperature between about 200° C. and about 1200° C. In some implementations, the method further includes after the annealing of the workpiece, removing the carbon layer. In some implementations, the carbon layer is amorphous. In some instances, the annealing of the workpiece includes a pressure between about 2 atmosphere and about 30 atmosphere.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
   a first contact feature in a first dielectric layer;
   a second dielectric layer over the first dielectric layer;
   a third dielectric layer over the second dielectric layer;
   a second contact feature extending through the second dielectric layer and the third dielectric layer; and
   a graphene layer between the second contact feature and the third dielectric layer,
   wherein the second contact feature is formed of a seed metal that includes a catalytic surface for graphene formation.

2. The interconnect structure of claim 1,
   wherein the second contact feature comprises a contact via portion and a metal line portion,
   wherein the contact via portion of the second contact feature is disposed within the second dielectric layer,
   wherein the metal line portion of the second contact feature is disposed within the third dielectric layer.

3. The interconnect structure of claim 1, wherein the second contact feature comprises nickel, cobalt, iron, copper, or cupronickel.

4. The interconnect structure of claim 1, further comprising carbon atoms disposed in grain boundaries of the second contact feature.

5. The interconnect structure of claim 1, wherein an interface between the second dielectric layer and the third dielectric layer is free of the graphene layer.

6. The interconnect structure of claim 1, further comprising an etch stop layer disposed between the first dielectric layer and the second dielectric layer,
wherein the graphene layer is disposed between the second contact feature and the etch stop layer.

7. The interconnect structure of claim 1, wherein the graphene layer comprises a thickness between 3 Å and 20 Å.

8. An interconnect structure comprising:
a first contact feature in a first dielectric layer;
an etch stop layer over the first dielectric layer;
a second dielectric layer over the etch stop layer;
a second contact feature extending through the second dielectric layer and electrically coupled to the first contact feature; and
a carbon layer between and in contact with the second contact feature and the first contact feature, wherein the carbon layer extends continuously along an interface between the second contact feature and the first contact feature.

9. The interconnect structure of claim 8, wherein the carbon layer comprises a graphene layer.

10. The interconnect structure of claim 8, wherein the second contact feature is free of carbon atoms.

11. The interconnect structure of claim 8,
wherein the carbon layer comprises a first portion disposed between the second contact feature and the second dielectric layer and a second portion disposed between the second contact feature and the first contact feature,
wherein the first portion comprises a first thickness and the second portion comprises a second thickness smaller than the first thickness.

12. The interconnect structure of claim 8, wherein a dielectric constant of the etch stop layer is greater than dielectric constants of the first and second dielectric layers.

13. The interconnect structure of claim 8, wherein the second contact feature comprises nickel, cobalt, iron, copper, or cupronickel.

14. An interconnect structure comprising:
a first contact feature in a first dielectric layer;
an etch stop layer over the first dielectric layer;
a second dielectric layer directly on the etch stop layer;
a third dielectric layer directly on the second dielectric layer;
a second contact feature extending through the third dielectric layer, the second dielectric layer, and the etch stop layer and electrically coupled to the first contact feature; and
a carbon layer between and in contact with the second contact feature and the third dielectric layer,
wherein the carbon layer extends along an interface between the first contact feature and the second contact feature.

15. The interconnect structure of claim 14, wherein the carbon layer comprises a graphene layer.

16. The interconnect structure of claim 14, wherein the carbon layer is further disposed between and in contact with the second contact feature and the second dielectric layer.

17. The interconnect structure of claim 14, wherein the carbon layer is further disposed between and in contact with the second contact feature and the etch stop layer.

18. The interconnect structure of claim 14, wherein the second contact feature is spaced apart from the second dielectric layer by the carbon layer.

19. The interconnect structure of claim 14, wherein a portion of the third dielectric layer is disposed over the second contact feature.

20. The interconnect structure of claim 14,
wherein the second contact feature comprises a via portion disposed in the second dielectric layer and a metal line portion disposed in the third dielectric layer,
wherein the metal line portion comprises a tapered profile such that a bottom width of the metal line portion is greater than a top width of the metal line portion.

* * * * *